US012047088B2

(12) United States Patent
Santos Martinez et al.

(10) Patent No.: US 12,047,088 B2
(45) Date of Patent: Jul. 23, 2024

(54) DATA TRANSFER BETWEEN ANALOG AND DIGITAL INTEGRATED CIRCUITS

(71) Applicant: Apple Inc., Cupertino, CA (US)

(72) Inventors: Jose V Santos Martinez, San Jose, CA (US); Yongxuan Hu, San Jose, CA (US); Nileshbhai J Shah, Irvine, CA (US)

(73) Assignee: Apple Inc., Cupertino, CA (US)

( * ) Notice: Subject to any disclaimer, the term of this patent is extended or adjusted under 35 U.S.C. 154(b) by 220 days.

(21) Appl. No.: 17/804,920

(22) Filed: Jun. 1, 2022

(65) Prior Publication Data

US 2023/0198538 A1    Jun. 22, 2023

Related U.S. Application Data

(60) Provisional application No. 63/265,793, filed on Dec. 21, 2021.

(51) Int. Cl.
*H03M 1/12* (2006.01)
*G06F 5/06* (2006.01)
*H03M 1/00* (2006.01)

(52) U.S. Cl.
CPC ............ *H03M 1/1255* (2013.01); *G06F 5/06* (2013.01); *H03M 1/123* (2013.01); *H03M 1/126* (2013.01); *H03M 1/002* (2013.01); *H03M 1/12* (2013.01); *H03M 1/1265* (2013.01)

(58) Field of Classification Search
CPC .... H03M 1/12; H03M 1/1255; H03M 1/1265; H03M 1/123; H03M 1/126; H03M 1/002; G06F 5/06
See application file for complete search history.

(56) References Cited

U.S. PATENT DOCUMENTS

| | | |
|---|---|---|
| 2009/0296535 A1 | 12/2009 | Jones |
| 2012/0104867 A1 | 5/2012 | Mudrick |
| 2014/0091634 A1 | 4/2014 | Mayo |
| 2016/0181818 A1 | 6/2016 | Joye |
| 2016/0344236 A1 | 11/2016 | Misawa |
| 2017/0018977 A1 | 1/2017 | Van Wageningen |
| 2017/0033591 A1 | 2/2017 | Govindaraj |
| 2018/0097406 A1 | 4/2018 | Chen |

(Continued)

FOREIGN PATENT DOCUMENTS

WO    WO-2013123359 A2 *  8/2013  ......... A61B 5/04004

*Primary Examiner* — Joseph J Lauture
(74) *Attorney, Agent, or Firm* — FLETCHER YODER PC

(57) ABSTRACT

A data processing system can include a first IC including one or more A/D converters that receive analog inputs from one or more sensors and generate corresponding digital data, a second IC including one or more processing elements that operate on the digital data, and communication circuitry, coupled between the one or more A/D converters and processing elements, that includes a packetizer on the first IC that receives samples and sample data from the one or more A/D converters and assembles each sample and corresponding sample data into a packet, a primary physical interface on the first IC that communicates the packet to a secondary physical interface on the second IC, and a de-packetizer that on the second IC that receives the packet, de-packetizes it, and delivers the sample and sample data to the one or more processing elements.

22 Claims, 4 Drawing Sheets

(56) References Cited

U.S. PATENT DOCUMENTS

| | | |
|---|---|---|
| 2019/0157907 A1 | 5/2019 | Sugiyama |
| 2019/0173316 A1 | 6/2019 | Shin |
| 2019/0229561 A1 | 7/2019 | Vocke |
| 2019/0386523 A1 | 12/2019 | Jung |
| 2020/0083746 A1 | 3/2020 | Lisi |
| 2020/0365316 A1 | 11/2020 | Tikka |
| 2021/0050746 A1 | 2/2021 | Malan |
| 2021/0328443 A1 | 10/2021 | Wolgemuth |
| 2021/0367453 A1 | 11/2021 | Galigekere |

* cited by examiner

DATA TRANSFER BETWEEN ANALOG AND DIGITAL INTEGRATED CIRCUITS

CROSS-REFERENCE TO RELATED APPLICATIONS

This application claims priority to and benefit of U.S. Provisional Application No. 63/265,793, filed Dec. 21, 2021, and entitled "DATA TRANSFER BETWEEN ANALOG AND DIGITAL INTEGRATED CIRCUITS," which is incorporated herein by reference in its entirety for all purposes.

BACKGROUND

Technological advances in computerized processing, networking, and sensing have resulted in the proliferation of systems in which digital controllers are used to sense data, analyze the sensed data, and use the resulting analysis to control various processes. Many such systems employ analog to digital converters (ADCs) to convert information from an analog sensor into a digital form that can be used by a digital controller, such as a microcontroller, microprocessor, or the like. In some applications, size, packaging, power consumption, or other constraints may dictate particular integration requirements with respect to the sensor circuitry, ADC circuitry, and processor circuitry. For example, in some applications, two or more of the aforementioned circuitry blocks may be combined in a single integrated circuit, while in other applications, the systems may be separated.

SUMMARY

For application in which sensor and/or analog to digital circuitry is in an integrated circuit separate from the processing circuitry, a communication or data transfer mechanism may be used to transfer the data from the ADC(s) to the processing circuitry. Disclosed herein is a data transfer system that may have advantages in speed, flexibility, and other aspects for certain applications including those in which the general purposes processing bandwidth of the system is otherwise constrained.

A data processing system can include a first integrated circuit including one or more analog to digital converters that receive analog inputs from one or more sensors and generate corresponding digital data, a second integrated circuit including one or more processing elements that operate on the digital data, and communication circuitry coupled between the one or more analog to digital converters and the one or more processing elements. The communication circuitry can include a packetizer on the first integrated circuit that receives samples and sample data from the one or more analog to digital converters and assembles each sample and corresponding sample data into a packet, a primary physical interface on the first integrated circuit that communicates the packet to a secondary physical interface on the second integrated circuit, and a de-packetizer that on the second integrated circuit that receives the packet, de-packetizes it, and delivers the sample and sample data to the one or more processing elements.

The one or more analog to digital converters can include at least one high speed analog to digital converter and at least one low speed analog to digital converter. The one or more processing elements can include at least one microprocessor or microcontroller core. The one or more processing elements can further include at least one hardware processor. The first integrated circuit can be built using a first process node, and the second integrated circuit can be built using a second process node. The packetizer can include a memory and a state machine that assembles data packets including a source identifier, the sample data, and the sample. The memory can be a first-in-first-out buffer. The de-packetizer includes a de-multiplexer and a plurality of registers, wherein the de-multiplexer extracts samples and sample data from the packets and stores the samples and sample data in one of the plurality of registers based on a source identifier of the packet. The one or more processing elements can retrieve sample data and samples from the plurality of registers. The primary physical interface and secondary physical interface can be coupled by a plurality of signal lines including a select/enable line, a clock line, and a plurality of data lines.

An integrated circuit can include one or more analog to digital converters that receive analog inputs from one or more sensors and generate corresponding digital data and communication circuitry coupled to the one or more analog to digital converters. The communication circuitry can include a packetizer that receives samples and sample data from the one or more analog to digital converters and assembles each sample and corresponding sample data into a packet and a primary physical interface that communicates the packet to a secondary physical interface on another integrated circuit. The one or more analog to digital converters can include at least one high speed analog to digital converter and at least one low speed analog to digital converter. The packetizer can include a memory and a state machine that assembles a data packet including a source identifier, the sample data, and the sample. The memory can be a first-in-first-out buffer. Each data packet can further include one or more parity bits for error handling, a start bit indicating whether this is the beginning of a sample or a continuation of a continuous stream, and a packet type bit indicating whether the packet corresponds to a high speed ADC packet or a low speed ADC packet. Each data packet can further include a slot identifier corresponding to a register to which the data packet is to be delivered.

An integrated circuit can include one or more processing elements that operate on digital data from one or more analog to digital converters on another integrated circuit and communication circuitry coupled to the other integrated circuit. The communication circuitry can include a secondary physical interface that receives packets including analog to digital converter data from a secondary physical interface on the other circuit, and a de-packetizer that receives the packet, de-packetizes it, and delivers a sample and sample data from the packet to the one or more processing elements. The one or more processing elements can include at least one microprocessor or microcontroller core. The one or more processing elements can further include at least one hardware processor. The de-packetizer can include a de-multiplexer and a plurality of registers, wherein the de-multiplexer extracts samples and sample data from the packets and stores the samples and sample data in one of the plurality of registers based on a source identifier of the packet. The one or more processing elements can retrieve sample data and samples from the plurality of registers.

A data packet stored in a non-transitory medium can include a plurality of data bits corresponding to a sample from an analog to digital converter and a plurality of bits corresponding to sample data corresponding to the sample. The sample data can include a start bit indicating whether this is the beginning of a sample or a continuation of a continuous stream and a packet type bit indicating whether the packet corresponds to a high-speed ADC packet or a low speed ADC packet. The sample data can include a slot identifier corresponding to a register to which the data packet is to be delivered.

DETAILED DESCRIPTION

Figure 1:
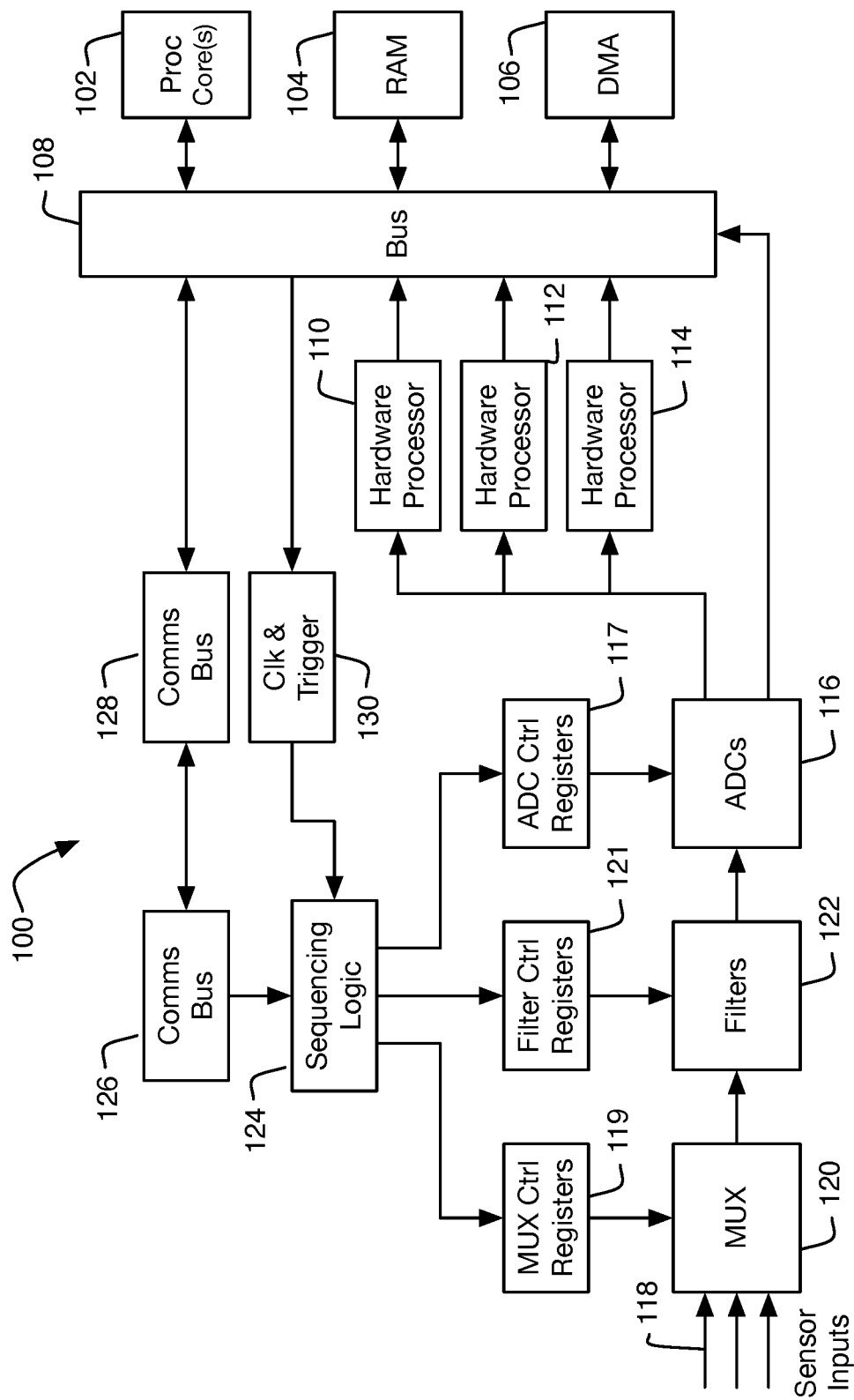
FIG. 1 is a block diagram of a processing system including analog and digital portions on a single integrated circuit.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth in order to provide a thorough understanding of the implementations described herein. In other instances, methods, procedures and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

FIG. 1 illustrates a block diagram of a processing system 100 including analog and digital portions on a single integrated circuit. The processing system includes processing core(s) 102. Processing core(s) 102 may include a single core or may be multiple cores, as required for a given application. Such cores may be general purpose microprocessor cores, having a relatively wide range of programmable capabilities. Alternatively, such cores may be microcontroller cores that may be more limited than more general purposes microprocessors in capability and/or capacity. In the case of systems with multiple processing cores, the cores may be identical (homogenous multiprocessor systems) or may be different (heterogenous multiprocessor systems). In the case of the latter, some processing cores may be optimized for higher processing speed or capability, potentially at the expense of higher power consumption (e.g., "performance cores"), while others may be optimized for lower power consumption, potentially at the expense of decreased processing speed or capability (e.g., efficiency cores). Any and all of the various processing configuration described or suggested above are referred to herein as "processor(s)" 102.

Processing system 100 may also include memory 104, e.g., a random access memory, and a direct memory access (DMA) controller 106. The processing core(s) 102, memory 104, and DMA controller 106 may be interconnected by a suitable bus 108. Numerous implementations of processing core(s) 102, memory 104, DMA controller 106, and bus 108 are available, and thus details of their construction and implementation are omitted for brevity.

In some implementations, the processing capabilities of processor 102 may be such that it is desirable to provide one or more dedicated hardware processors 110, 112, and 114. These hardware processors can include electronic circuitry that performs a single function (or a relatively small number of functions). In many applications, such circuitry can perform its function substantially faster or more efficiently than if processor 102 were programmed to perform the same function. In the example system 100, hardware processors 110, 112, and 114 are configured to receive inputs from analog to digital converters (ADCs) 116 discussed in greater detail below. Additionally, hardware processors 110, 112, and 114 are connected to bus 108, allowing them to deliver their output data to processor 102, memory 104, and/or DMA controller 106 as appropriate. Examples of such dedicated hardware processors are described in Applicant's co-pending U.S. Provisional patent application Ser. No. 17/457,374, filed Dec. 2, 2021, entitled "Wireless Power Transfer with Integrated Communications," which is hereby incorporated by reference in its entirety.

One or more analog to digital converters (ADCs) 116 can convert analog data from a plurality of sensor inputs 118 into a digital form that can be processed by hardware processors 110, 112, and 114 and/or processor 102 as required. In some applications, the number of sensors/sensor inputs 118 may be greater than the number of analog to digital converters and/or analog to digital converter channels available. In such applications multiplexer(s) 120 may be employed to selectively connect sensor signals to the appropriate analog to digital converters. This selectivity may be controlled by multiplexer control registers 119, discussed in greater detail below. Additionally, in some applications, it may be desirable to selectively apply various filters 122 to the sensor input signals before they are digitized by ADCs 116. This selectivity may be controlled by one or more filter control registers 121, discussed in greater detail below. Finally, depending on the requirements of a particular application, one or more analog to digital converters (and/or multi-channel analog to digital converters) may be provided. In some cases, the multiple analog to digital converters may have differing capabilities. For example, some analog to digital converters may be higher speed ADCs suitable for dealing with higher frequency signals and/or providing higher sample rates. Other ADCs may be lower speed ADCs, relative to the aforementioned higher speed ADCs, that are suitable for dealing with lower frequency signals and/or providing lower sample rates. Additionally, the ADCs may be capable of operating in different modes, such as a continuous conversion mode or a manual conversion mode and may be configured to operate with different triggering events and timings. These and other aspects of ADC operation can be controlled by ADC control registers 117, discussed in greater detail below.

In some applications, operation of the sensor signal train described above may be controlled by processor 102 and/or by one or more of hardware processors 110, 112, and 114. To that end, control signals from one of these processing elements may be delivered via bus 108 to a communication bus 128 and/or clock and trigger circuitry 130, which in turn may be coupled to communication bus 126 and sequencing logic 124. Communication bus 128 may be any of a variety of standard or specialized busses used for communication between various processing circuitry and other components using relatively higher-level communications, in which information is packaged using a relatively higher level protocol. For example, communication bus 128/126 may be an I2C bus. Conversely, clock and trigger circuitry 130 and sequencing logic 124 may be implemented as lower-level circuitry in which particular digital signal aspects such as high-to-low, low-to-high transitions, frequencies or timing, and the like are used to implement control based on lower level digital signaling. Such circuitry may be implemented using simpler discrete logic elements, such as logic gates, flip flops, and the like. Any of a wide variety of combinations are possible for both communications bus 128/126 and clock and trigger circuitry 130 and sequencing logic 124. In any case, these elements may interact according to any such design to provide the desired signaling/values to multiplexer control registers 119 (which control the multiplexer(s) as described above), filter control registers 121 (which control the filter(s) as described above), and ADC control registers 117 (which control the analog to digital converters as described above).

Processing system may be implemented on a single integrated circuit. Such an integrated circuit may be produced using a particular process or technology "node," which refers to a particular formation process and the associated design rules for that process. Some process nodes may be more advantageously employed in the production of analog circuits, including for example analog to digital converters 116 and portions of their signal train. Other process nodes may be more advantageously employed in the production of digital processor circuits, such as processors 102. As a result, a single integrated circuit implementation as described above with reference to FIG. 1 may result in certain portions of the circuitry having a sub-optimal layout or construction. For example, certain circuitry blocks depicted above may be larger than they would be on another node, or may have to be positioned in a way that enlarges the total circuit or creates signaling issues, etc. These and other factors may dictate a two-chip solution for some systems, in which analog related circuitry is produced on a first integrated circuit (chip) while digital processing related circuitry is produced on a second integrated circuit (chip). Such an arrangement is illustrated in FIG. 2.

Figure 2:
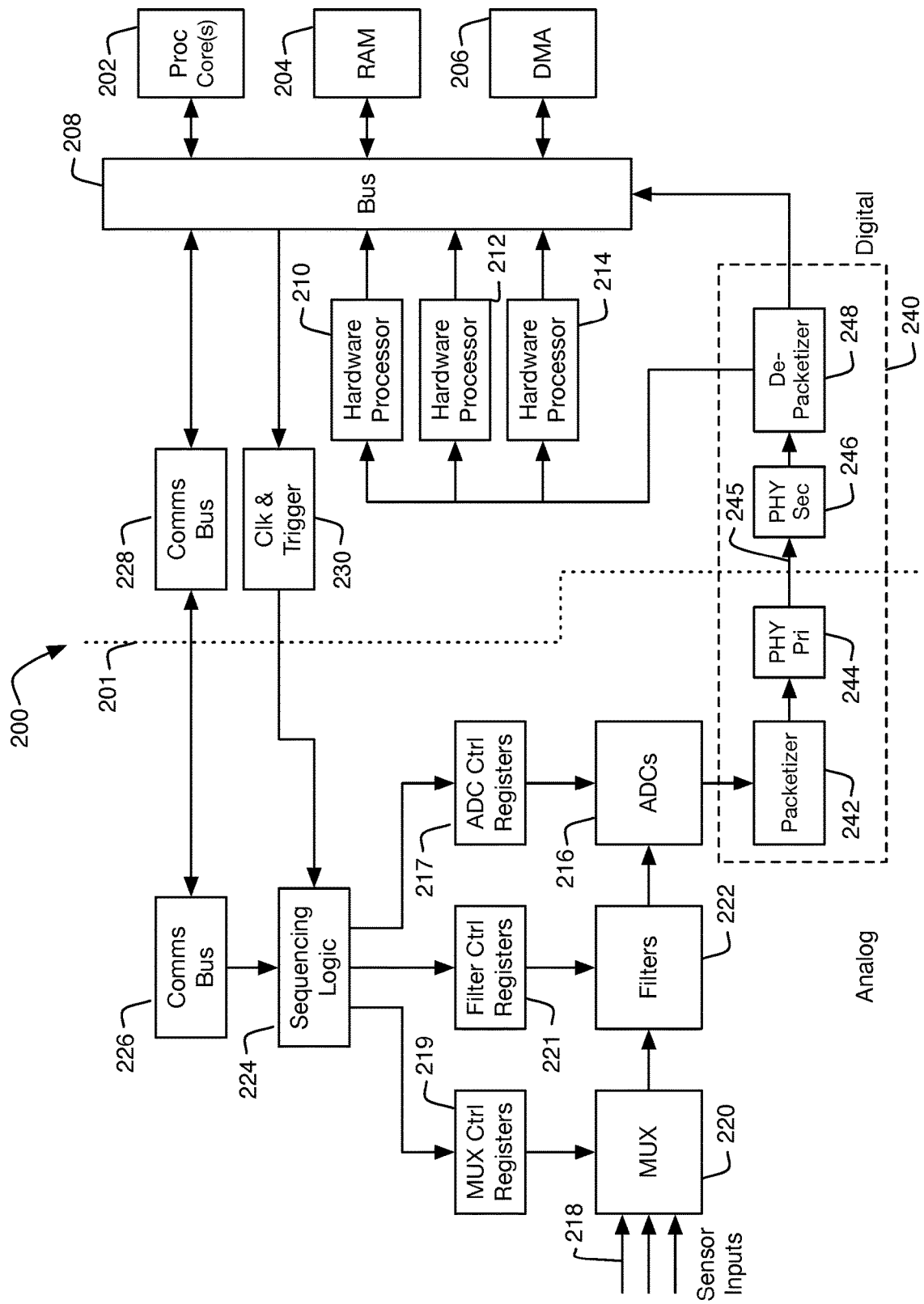
FIG. 2 is a block diagram of a processing system including analog portions on a first integrated circuit and digital portions on a second integrated circuit.

FIG. 2 illustrates a block diagram of a processing system 200 including analog and digital portions on separate integrated circuits (chips). Dotted line 201 illustrates the separation between the respective chips. Processing system 200 includes processing core(s) 202. Processing core(s) 202 may include a single core or may be multiple cores, as required for a given application. Such cores may be general purpose microprocessor cores, having a relatively wide range of programmable capabilities. Alternatively, such cores may be microcontroller cores that may be more limited than more general purposes microprocessors in capability and/or capacity. In the case of systems with multiple processing cores, the cores may be identical (homogenous multiprocessor systems) or may be different (heterogenous multiprocessor systems). In the case of the latter, some processing cores may be optimized for higher processing speed or capability, potentially at the expense of higher power consumption (e.g., "performance cores"), while others may be optimized for lower power consumption, potentially at the expense of decreased processing speed or capability (e.g., efficiency cores). Any and all of the various processing configuration described or suggested above are referred to herein as "processor(s)" 202.

Processing system 200 may also include memory 204, e.g., a random access memory, and a direct memory access (DMA) controller 206. The processing core(s) 202, memory 204, and DMA controller 206 may be interconnected by a suitable bus 208. Other implementations of processing core(s) 202, memory 204, DMA controller 206, and bus 208 are available, and thus details of their construction and implementation are omitted for brevity.

In some implementations, the processing capabilities of processor 202 may be such that it is desirable to provide one or more dedicated hardware processors 210, 212, and 214. These hardware processors can include electronic circuitry that performs a single function (or a relatively small number of functions). In many applications, such circuitry can perform its function substantially faster or more efficiently than if processor 202 were programmed to perform the same function. In the example system 200, hardware processors 210, 212, and 214 are configured to receive inputs from analog to digital converters (ADCs) 216 via communications circuitry 240 discussed in greater detail below. Additionally, hardware processors 210, 212, and 214 are connected to bus 208, allowing them to deliver their output data to processor 202, memory 204, and/or DMA controller 206 as appropriate. Examples of such dedicated hardware processors are described in Applicant's co-pending U.S. Provisional Patent Application entitled "Wireless Power Transfer with Integrated Communications," incorporated by reference above.

One or more analog to digital converters (ADCs) 216 can convert analog data from a plurality of sensor inputs 218 into a digital form that can be processed by hardware processors 210, 212, and 214 and/or processor 202 as required. In some applications, the number of sensors/sensor inputs 218 may be greater than the number of analog to digital converters and/or analog to digital converter channels available. In such applications multiplexer(s) 220 may be employed to selectively connect sensor signals to the appropriate analog to digital converters. This selectivity may be controlled by multiplexer control registers 219, discussed in greater detail below. Additionally, in some applications, it may be desirable to selectively apply various filters 222 to the sensor input signals before they are digitized by ADCs 216. This selectivity may be controlled by one or more filter control registers 221, discussed in greater detail below. Finally, depending on the requirements of a particular application, one or more analog to digital converters (and/or multichannel analog to digital converters) may be provided. In some cases, the multiple analog to digital converters may have differing capabilities. For example, some analog to digital converters may be "high speed" ADCs suitable for dealing with higher frequency signals and/or providing higher sample rates. Other ADCs may be "low speed" ADCs that are suitable for dealing with lower frequency signals and/or providing lower sample rates. Additionally, the ADCs may be capable of operating in different modes, such as a continuous conversion mode or a manual conversion mode and may be configured to operate with different triggering events and timings. These and other aspects of ADC operation can be controlled by ADC control registers 217, discussed in greater detail below.

In some applications, operation of the sensor signal train described above may be ultimately controlled by processor 202 and/or by one or more of hardware processors 210, 212, and 214. To that end, control signals from one of these processing elements may be delivered via bus 208 to a communication bus 228 and/or clock and trigger circuitry 230, which in turn may be coupled to communication bus 226 and sequencing logic 224. Communication bus 228 may be any of a variety of standard or specialized busses used for communication between various processing circuitry and other components using relatively higher-level communications, in which information is packaged using a relatively higher level protocol. For example, communication bus 228/226 may be an I2C bus. Conversely, clock and trigger circuitry 230 and sequencing logic 224 may be implemented as lower-level circuitry in which particular digital signal aspects such as high-to-low, low-to-high transitions, frequencies or timing, and the like are used to implement control based on lower level digital signaling. Such circuitry may be implemented using simpler discrete logic elements, such as logic gates, flip flops, and the like. Any of a wide variety of combinations are possible for both communications bus 228/226 and clock and trigger circuitry 230 and sequencing logic 224. In any case, these elements may interact according to any such design to provide the desired signaling/values to multiplexer control registers 219 (which control the multiplexer(s) as described above), filter control registers 221 (which control the filter(s) as described above, and ADC control registers 217 (which control the analog to digital converter(s) as described above).

To facilitate communication of the digitized sensor data from analog to digital converter(s) 216 to the various processing components, communication circuitry 240 may be employed. On the "analog" chip side, communication circuitry can include a packetized 242 that forms the ADC output data into a plurality of packets as described in greater detail below. These packets can then be delivered to a primary physical communications interface 244, and primary physical communication interface 244 may communicate via signals 245 with a corresponding secondary physical communication interface 246 on the "digital" chip side. The physical communication interfaces 244, 246 are described in greater detail below. Secondary physical communication interface 246 can deliver the packets to a depacketizer 248, also described in greater detail below. Depacketizer can then deliver the digitized sensor data to hardware processors 210, 212, and 214 and/or to processor 202, memory 204, or DMA controller 206 via bus 208 in a manner generally corresponding to that described above with reference to FIG. 1.

Figure 3:
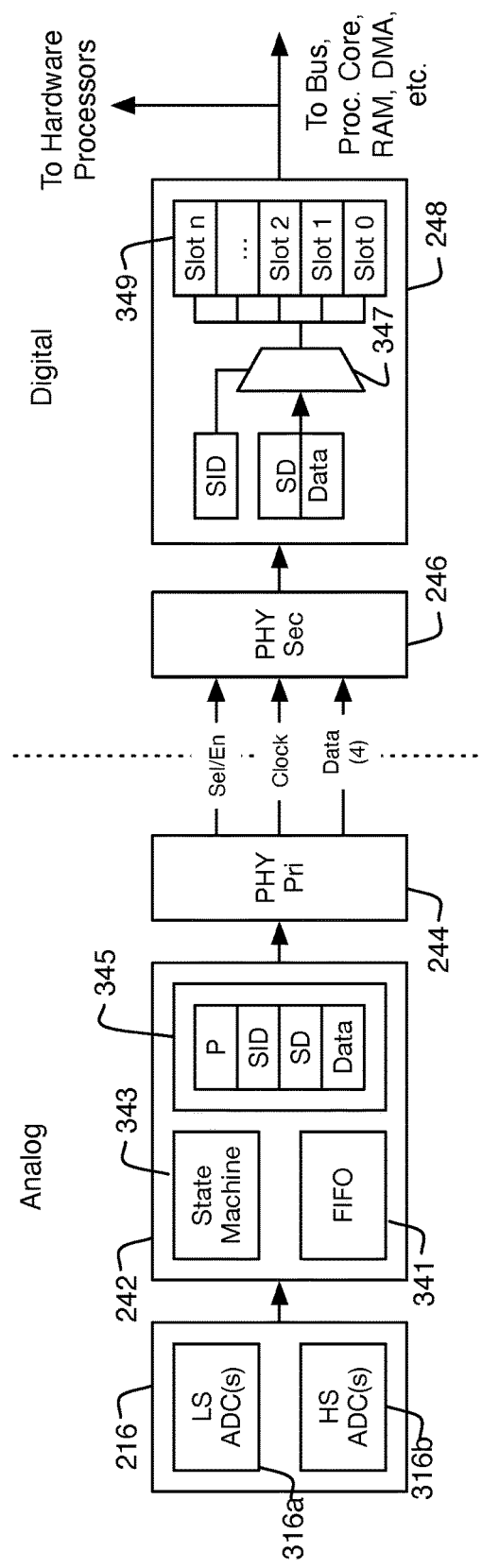
FIG. 3 is an expanded block diagram of a data transfer link between an analog integrated circuit and a digital integrated circuit.

FIG. 3 illustrates an expanded block diagram of communication circuitry 240, including packetizer 242, primary physical interface 244, secondary physical interface 246, and depacketizer 248. Beginning on the left-hand side of the diagram, packetizer 242 can receive data from analog to digital converters (ADCs) 216, which can include one or more low speed analog to digital converters 316a and one or more low speed analog to digital converters 316b. To merge the data from the low-speed ADC(s) 316a with the data from high speed ADC(s) 316b, packetizer 242 can implement a storage buffer, e.g., first-in-first-out or FIFO buffer 341, controlled by a state machine 343. State machine 343, which can be constructed using suitable logic gates, flip-flops, and the like, can ensure that incoming sample data from the ADC(s) is stored in the buffer 341. Buffer 341 may be sized to account for the respective sample rates of the ADC(s) and the speed of the physical communication interface described in greater detail below. State machine 343 can also direct the formation of data packets 345 from the data stored in the buffer. Each data packet may correspond to a single sample from one of the plurality of ADCs and can include: (1) parity bit(s) P for error handling; (2) a slot identifier SID identifying which sensor/channel is being measured; (3) sample data SD that provides information about the sample such as a start bit, conversion type (continuous vs. manual), etc., and (4) and the sample data itself illustrated as "Data." The packets may be structured in any of a variety of ways. Two example packet structures are described in greater detail below with reference to FIG. 4.

Packetizer 242 can deliver the formed packets to primary physical interface 244, which can communicate with a corresponding secondary physical interface 246. Together these form the physical interface layer. This physical interface layer can take a variety of forms depending on the particular requirements of a given implementation. In the illustrated embodiment, the physical interface can be implemented using the illustrated signaling, in which a select/enable (Sel/En) signal, clock signal, and a plurality of data lines are coupled between the primary and secondary physical interfaces. When the select/enable is asserted and the clock signal transitions, a data bit can be sent on each of the plurality of data lines. In the illustrated example, four data lines are used, although greater or lesser numbers of data lines could be used as appropriate for a given embodiment. Such an arrangement can be, in some respects, similar to serial peripheral interface (SPI) communications, but with a multiplicity of data lines (i.e., a wider data bus), and, in the illustrated example, only a single secondary device, meaning that the select/enable signal can be omitted in favor of a fixed high (or low) at the secondary. Further details of the physical layer signaling are discussed below with reference to FIG. 5.

Secondary physical interface 246 can deliver the received packet to depacketizer 248. Depacketizer 248 can include error handling circuitry (not shown) that can analyze the received parity bits as compared to the received data and determine whether there was a transmission error. If so, the received data may be discarded or corrected, if possible. In come embodiments, retransmission of the corrupted data may be requested. Otherwise, the slot identifier bits SID may be used to control a de-multiplexer 347. De-multiplexer may take the sample data SD (including data about the sample, as described above) and the sample itself (Data) and deliver them to a corresponding slot 349. These slots may be registers for receiving the data. The various processing elements described above with reference to FIG. 2, i.e., processor 202 and/or hardware processors 210, 212, and 214 can then retrieve the sample data and sample from the respective slots.

What appears in each slot at a given time may be either the result of a fixed configuration or may be controlled by the communications bus 228/226 and/or clock and trigger circuitry 230, and sequencing logic 224, as discussed above. As an example of a fixed configuration, data from a high-speed analog to digital converter may always be committed to a particular slot (e.g., Slot 0), and the various processing elements may be configured to always retrieve high speed sample data from that slot. As an example of a timed configuration, various processing elements may be configured to expect that slots corresponding to a particular sensor/signal channel will be in a particular slot at a given time, and the particular slot may vary from one instance to the next for a given sensor. Thus, there may be fewer slots than the number of sensors and/or analog to digital converters, as a given slot may be used for different sensor channels at different times. Because the sample data as well as samples themselves are delivered to the respective slots, the various processing elements (i.e., processor 202 or hardware processors 210, 212, and 214) can process the full information from the ADCs as required.

Figure 4:
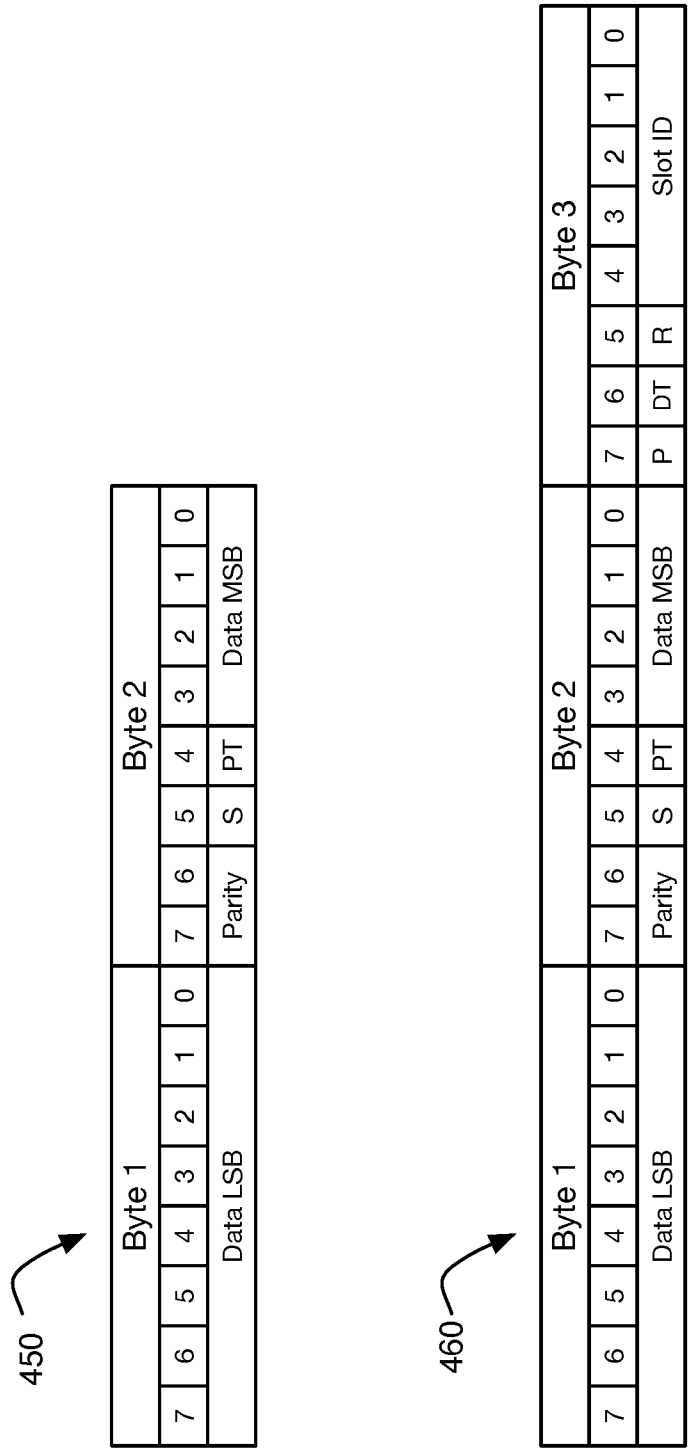
FIG. 4 illustrates exemplary packets that may be used in connection with the data transfer link of FIG. 3.

FIG. 4 illustrates a first packet diagram for a 16-bit packet 450 that may be assembled by packetizer 242. The packet is for transmission to depacketizer 248 and may be stored in a memory, such as an output buffer of packetizer 242, an input buffer of depacketizer 248, or an intermediate buffer associated with primary physical interface 244 or secondary physical interface 246. The 16 bit packet can include a first byte made up bits 0:7 and a second byte made up of bits 0:7. In the first bite, the 8 bits 0:7 may be used to send the least significant byte of the sample. The first two bits of the second byte may include parity data for the first and second bytes. The third bit (i.e., bit 5) may be a start bit S indicating whether this is the beginning of a sample or a continuation of a continuous stream. The fourth bit (i.e., bit 4) may be a packet type flag, indicating, for example, whether the packet corresponds to a high-speed ADC packet or a low speed ADC packet. The last four bits of the second byte (i.e., bits 0:3) can be the most significant bits of the sample. In some embodiments the 16-bit packets may be used for applications in which samples from a given ADC are placed into a dedicated slot, as the slot ID data can be omitted. More specifically, in some embodiments, high speed ADC samples may be provided to a dedicated slot in depacketizer 248.

FIG. 4 also illustrates a second packet diagram for a 24-bit packet 460 that may be assembled by packetizer 242. The packet is for transmission to depacketizer 248 and may be stored in a memory, such as an output buffer of packetizer 242, an input buffer of depacketizer 248, or an intermediate buffer associated with primary physical interface 244 or secondary physical interface 246. The 24-bit packet can include a first byte made up bits 0:7, a second byte made up of bits 0:7, and a third byte made up of bits 0:7. As with packet 450, in the first bite, the 8 bits 0:7 may be used to send the least significant byte of the sample. The first two bits of the second byte may include parity data for the first and second bytes. The third bit (i.e., bit 5) may be a start bit S indicating whether this is the beginning of a sample or a continuation of a continuous stream. The fourth bit (i.e., bit 4) may be a packet type flag, indicating, for example, whether the packet corresponds to a high-speed ADC packet or a low speed ADC packet. The last four bits of the second byte (i.e., bits 0:3) can be the most significant bits of the sample. The third byte can include an additional parity bit P (i.e., bit 7) and a data type bit DT (i.e., bit 6) indicating whether the sample is a continuous conversion sample or a manual conversion sample. The third bit of byte 3 (i.e., bit 5) may be reserved, with the remaining bits (0:4) being the slot ID, indicating the slot into which the demultiplexer of depacketizer 248 should put the sample data and sample. In some embodiments the 24-bit packets may be used low speed ADC samples. The above-described packet structures are exemplary only. Other packet structures including more or fewer numbers of bits, with different configurations and including additional data or omitting some of the above-described data may also be used as appropriate. Any packet configuration that provides the required sample, sample data, and information allowing the data to be delivered to the appropriate location for access by the processing units may be used.

Figure 5:
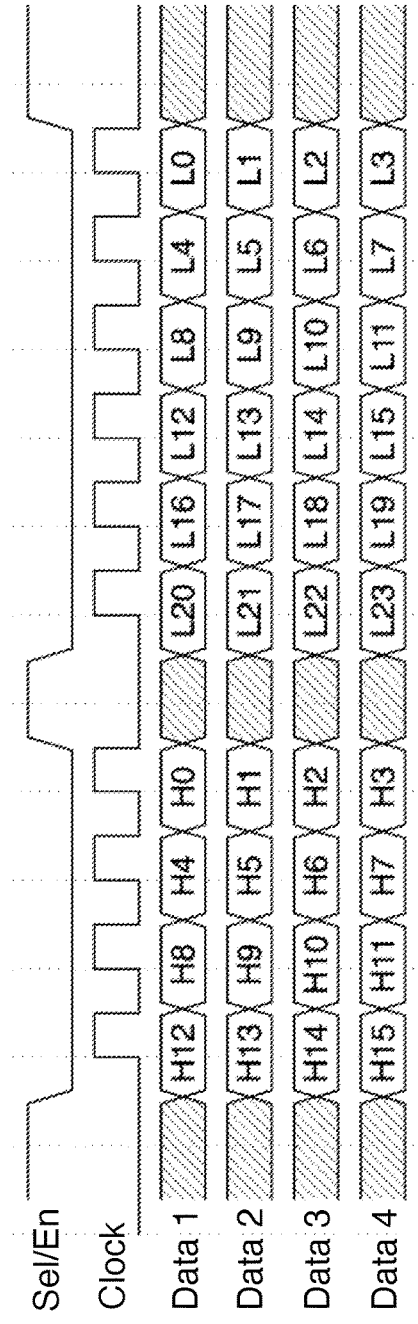
FIG. 5 illustrates exemplary timing diagrams of a data transfer link of FIG. 3.

FIG. 5 illustrates an exemplary timing diagram for the physical interfaces 244 and 246 described above with reference to FIGS. 2-3. The signals include the select/enable signal (Sel/En), a clock signal, and four data lines Data 1-Data 4. As described above, more or fewer data lines may be provided depending on the particulars of a given application. When enabled (corresponding to a low Sel/En signal in FIG. 5), on each pulse of the clock signal, four bits of a given data packet can be transmitted from primary physical interface 244 to secondary physical interface 246. Thus, for a 16-bit packet as described above four clock cycles will be required to transmit the 16 bits H0:H15, as shown. Similarly, for a 24-bit packet as described above six clock cycles will be required to transmit the 24 bits L0:L23, as shown. For various packet lengths and numbers of data lines, the total number of clock cycles can vary accordingly, with fewer data lines requiring more clock cycles and more data lines allowing fewer clock cycles. Thus, the bus width (i.e., number of data lines) and clock frequency may be selected to allow for a desired sample rate for each of the various ADCs and corresponding sensors to be delivered to the processing hardware.

The foregoing describes exemplary embodiments of data processing systems including analog and digital integrated circuits and techniques for delivering data between them. Such systems may be used in a variety of applications but may be particularly advantageous when in conjunction with systems in which differing process nodes for analog vs. digital circuitry allow for improved performance, cost, area, or other requirements. Although numerous specific features and various embodiments have been described, it is to be understood that, unless otherwise noted as being mutually exclusive, the various features and embodiments may be combined in various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

Additionally, it is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A data processing system comprising:
a first integrated circuit including one or more analog to digital converters that receive analog inputs from one or more sensors and generate corresponding digital data;
a second integrated circuit including one or more processing elements that operate on the digital data; and
communication circuitry coupled between the one or more analog to digital converters and the one or more processing elements, the communication circuitry comprising:

a packetizer on the first integrated circuit that receives samples and sample data from the one or more analog to digital converters and assembles each sample and corresponding sample data into a packet;

a primary physical interface on the first integrated circuit that communicates the packet to a secondary physical interface on the second integrated circuit; and a de-packetizer that on the second integrated circuit that receives the packet, de-packetizes it, and delivers the sample and sample data to the one or more processing elements.

2. The data processing system of claim 1 wherein the one or more analog to digital converters include at least one high speed analog to digital converter and at least one low speed analog to digital converter.

3. The data processing system of claim 1 wherein the one or more processing elements include at least one microprocessor or microcontroller core.

4. The data processing system of claim 3 wherein the one or more processing elements further include at least one hardware processor.

5. The data processing system of claim 1 wherein the first integrated circuit is built using a first process node and the second integrated circuit is built using a second process node.

6. The data processing system of claim 1 wherein the packetizer includes a memory and a state machine that assembles data packets including a source identifier, the sample data, and the sample.

7. The data processing system of claim 6 wherein the memory is a first-in-first-out buffer.

8. The data processing system of claim 1 wherein the de-packetizer includes a de-multiplexer and a plurality of registers, wherein the de-multiplexer extracts samples and sample data from the packets and stores the samples and sample data in one of the plurality of registers based on a source identifier of the packet.

9. The data processing system of claim 8 wherein the one or more processing elements retrieve sample data and samples from the plurality of registers.

10. The data processing system of claim 1 wherein the primary physical interface and secondary physical interface are coupled by a plurality of signal lines including a select/enable line, a clock line, and a plurality of data lines.

11. An integrated circuit comprising:
one or more analog to digital converters that receive analog inputs from one or more sensors and generate corresponding digital data; and
communication circuitry coupled to the one or more analog to digital converters, the communication circuitry comprising:
a packetizer that receives samples and sample data from the one or more analog to digital converters and assembles each sample and corresponding sample data into a packet; and
a primary physical interface that communicates the packet to a secondary physical interface on another integrated circuit.

12. The integrated circuit of claim 11 wherein the one or more analog to digital converters include at least one high speed analog to digital converter and at least one low speed analog to digital converter.

13. The integrated circuit of claim 12 wherein the packetizer includes a memory and a state machine that assembles a data packet including a source identifier, the sample data, and the sample.

14. The integrated circuit of claim 13 wherein the memory is a first-in-first-out buffer.

15. The integrated circuit of claim 13 wherein each data packet further includes one or more parity bits for error handling, a start bit indicating whether this is the beginning of a sample or a continuation of a continuous stream, and a packet type bit indicating whether the packet corresponds to a high-speed ADC packet or a low-speed ADC packet.

16. The integrated circuit of claim 15 wherein each data packet further includes a slot identifier corresponding to a register to which the data packet is to be delivered.

17. An integrated circuit comprising:
one or more processing elements that operate on digital data from one or more analog to digital converters on another integrated circuit; and
communication circuitry coupled to the other integrated circuit, the communication circuitry comprising:
a secondary physical interface that receives packets including analog to digital converter data from a secondary physical interface on the other circuit; and
a de-packetizer that receives the packet, de-packetizes it, and delivers a sample and sample data from the packet to the one or more processing elements.

18. The integrated circuit of claim 17 wherein the one or more processing elements include at least one microprocessor or microcontroller core.

19. The integrated circuit of claim 18 wherein the one or more processing elements further include at least one hardware processor.

20. The integrated circuit of claim 17 wherein the de-packetizer includes a de-multiplexer and a plurality of registers, wherein the de-multiplexer extracts samples and sample data from the packets and stores the samples and sample data in one of the plurality of registers based on a source identifier of the packet.

21. The integrated circuit of claim 20 wherein the one or more processing elements retrieve sample data and samples from the plurality of registers.

22. A data packet stored in a non-transitory medium, the data packet including:
a plurality of data bits corresponding to a sample from an analog to digital converter; and
a plurality of bits corresponding to sample data corresponding to the sample, wherein the sample data includes a start bit indicating whether this is the beginning of a sample or a continuation of a continuous stream and a packet type bit indicating whether the packet corresponds to a high-speed ADC packet or a low-speed ADC packet, and wherein the sample data includes a slot identifier corresponding to a register to which the data packet is to be delivered.

\* \* \* \* \*